United States Patent [19]

Fondiller et al.

[11] 4,244,040
[45] Jan. 6, 1981

[54] MINIATURE ELECTRONIC DEVICE CONSTRUCTION

[75] Inventors: Robert Fondiller, 200 W. 58 St., New York, N.Y. 10019; Christian Grund, Bronx; Steve Dobler, Whitestone; Michael Braun, Brooklyn, all of N.Y.

[73] Assignee: Robert Fondiller, New York, N.Y.

[21] Appl. No.: 918,104

[22] Filed: Oct. 10, 1978

Related U.S. Application Data

[62] Division of Ser. No. 609,744, Sep. 2, 1975, abandoned.

[51] Int. Cl.³ ..................... G04C 17/00; G04C 23/02
[52] U.S. Cl. ........................................ 368/69; 368/88
[58] Field of Search ............... 58/23 R, 23 BA, 50 R, 58/88 R; 200/DIG. 1, DIG. 2, 159 R; 307/116

[56] References Cited

U.S. PATENT DOCUMENTS

| | | | |
|---|---|---|---|
| 3,759,031 | 9/1973 | McCullough et al. | 58/50 R |
| 3,879,618 | 4/1975 | Larson | 307/116 |
| 3,884,033 | 5/1975 | Wood | 58/23 R |
| 3,969,887 | 3/1976 | Fukumoto | 58/50 R |
| 3,973,099 | 8/1976 | Morris, Sr. | 200/159 R |
| 3,983,690 | 10/1976 | McCuntock | 58/50 R |
| 3,986,335 | 10/1976 | Harper | 58/50 R |
| 4,026,103 | 6/1977 | Ichikawa et al. | 58/50 R |
| 4,055,755 | 10/1977 | Nakamura et al. | 58/50 R X |
| 4,063,111 | 12/1977 | Doisler et al. | 307/116 |

*Primary Examiner*—Vit W. Miska

[57] ABSTRACT

A miniature electronic device, an example of which being an electronic watch, includes a printed circuit board which is mounted in a case and which has an aperture. A battery extends into the aperture forming a substantially coplanar assembly of exceptionally small thickness. The printed circuit board also features the use of circuit paths disposed on the peripheral edge to connect selected circuit paths which are disposed on upper and lower surface of the printed circuit board. An alternative embodiment of the printed circuit board features the use of a digit drives chip mounted directly on top of an integrated circuit watch clip with wire bonds leading from selected pads on the digit drives chip to selected pads on the integrated circuit watch chip and to selected circuit paths on the printed circuit board.

4 Claims, 34 Drawing Figures

MINIATURE ELECTRONIC DEVICE CONSTRUCTION

This application is a Division of Ser. No. 609,744, filed Sept. 2, 1975, now abandoned.

The present invention relates to miniature electronic devices as example of which being a digital watch of small size and exceptional thinness.

Miniature electronic devices conventionally feature the use of one or more printed circuit boards on which there are disposed a plurality of circuit paths which interconnect various circuit components that are mounted on the printed circuit board. An example of such a miniature electronic device is a digital watch. In the conventional construction of a digital watch, a watch case is provided containing: a printed circuit board, on the top of which there is mounted a digital display device, which is generally a light emitting diode or a liquid crystal device, an integrated circuit watch chip and suitable circuit connections. This printed circuit board is conventionally mounted on top of a pair of watch batteries which are placed inside the watch case. The overall height of the complete assembly is the sum of the individual thickness of the thickest component on the printed circuit board, the printed circuit board and the batteries. This results in a watch case which is thicker than conventional non-digital watches with the consequent bulkiness of the watch case leading to excessive weight and user discomfort. The requirement for substantial thickness in conventional digital watches leads to seven styling restrictions and to consumer resistance. This requirement for substantial thickness of the watch case in conventional digital watches also results in special disadvantages in the design of women's watches in which thinness, lightness and fineness of design are desired features.

The design of conventional digital watches also includes one or more push-button type switches to turn the display on and off. The push-button switches require closely machined component parts and spring elements and are relatively costly and subject to wear and other operational problems during extended use. In addition, the incorporation of push button switches requires a watch case of substantial thickness to support the push-button switches thus resulting in the disadvantages due to the thick watch case cited above.

The ultra-thin digital watch according to the present invention overcomes the limitations of the prior art by providing a digital watch of exceptional thinness which features an interstitial printed circuit board on which digital display devices and an integrated circuit watch chip are mounted. The digital display devices and the integrated circuit watch chip are disposed offset from a pair of watch batteries which are diposed, one each, in a pair of apertures formed in the interstitial printed circuit board. The watch batteries and the interstitial printed circuit board form a substantially co-planar assembly which achieves an unexpected degree of flatness which is otherwise unobtainable. Electrical contact between the watch batteries and the interstitial printed circuit board is made by means of leaf springs which are attached to the interstitial printed circuit board. In a first embodiment of the ultra-thin digital watch according to the present invention, the two apertures for the watch batteries are closely spaced and the interstitial area between the apertures is utilized for the mounting of circuit components such as a photo sensor which is used to regulate the brightness of the display devices. In a second embodiment, of the ultra-thin digital watch, the two apertures are spaced apart and the interstitial area between the apertures is utilized for the mounting of a digital display device and an integrated circuit watch chip. The second embodiment of the ultra thin watch chip has a generally elongated watch case which is slightly curved to conform to the wrist and which is mounted within a decorative bracelet.

The ultra-thin digital watch according to the present invention also features the use of a touch operated solid state switch to turn the digital display on. The touch operated switch includes a rivet which is mounted in an insulating sleeve on the watch case and which makes contact with a conductor disposed on the edge of the interstitial printed circuit board. Finger contact between the rivet and the watch case completes an electronic circuit, which includes a PNP bi-polar transistor, to turn the digital display on. The use of the solid state touch switch which requires less side wall area on the watch case than a conventional push-button type switch, and the low overall height of the internal components, achieved by the use of the interstitial printed circuit board, results in a watch case which may be manufactured by a stamping process rather than the forging process, used in the manufacture of conventional watch cases, thus achieving economy of manufacture.

The interstitial printed circuit board is protected either by coating the interstitial printed circuit board with a coating of a clear epoxy resin or alternatively by providing a transparent plastic printed circuit board protector. The printed circuit board protector is molded to conform to the contour of the components on the interstitial printed circuit board and fits closely over the surface of the interstitial printed circuit board. The printed circuit board protector has a rim which fits over the edge of the interstitial printed circuit board and which is cemented to the edge of the interstitial printed circuit board.

In order to utilize the minimum printed circuit board area, the present invention features a novel method of connecting the individual segments of the light emitting diode displays. Conventionally, the individual segments of a light emitting diode display are connected via wire bonds to individual circuit paths which are formed adjacent to the light emitting diodes. In contrast to the above, the interstitial printed circuit board according to the present invention features a direct wire bond between corresponding segments of adjacent light emitting diodes. The wire bond leads are run directly across the face of the light emitting diodes and the extreme thinness of the wire used prevents the wire from obscuring the display and makes the wire almost invisible to the naked eye.

The present invention also features a novel construction for connecting circuit paths which are disposed on the upper surface and on the lower surface of the printed circuit board. Conventionally, such circuit paths are connected by incorporating a drilled hole in the printed circuit board located in the path of both of the circuit paths which are to be connected. The hole has plating on its peripheral surface and this plating is in contact with both the upper and the lower circuit paths. This conventional construction is known as a plated-through hold. This construction requires a drilling operation and a relatively large area on the printd circuit board since circular pads are usually formed on the circuit paths in order to accommodate the drilled hole. In contrast to the above, in the printed circuit board, according to the present invention, the upper and lower circuit paths extend to the edge of the printed circuit board and a plated circuit path joining them is formed on the edge of the printed circuit board. This plated circuit path is disposed in a recessed portion of the edge of the printed circuit board thus preventing unwanted shorting of the circuit path to a case or container, within which the printed circuit board is mounted. The use of the edge connection, according to the present invention, results in a reduction in the overall size of the printed circuit board and an increase in the overall packaging efficiency of the electronic devices since the wasted area of the drilled hole and the area of the circular pad of the conventional printed circuit board is no longer needed and the central area of the printed circuit board can be used for the mounting of circuit components.

In conventional digital watches a digit driver chip, which is used to amplify the output current of an integrated circuit watch chip to the level required for operation of a display device, such as a light emitting diode, is mounted on a printed circuit board adjacent to an integrated circuit watch chip and circuit paths on the printed circuit board connect the two. This construction requires a wire bond on each end of each of the circuit paths connecting the digital driver chip and the integrated circuit watch chip.

In contrast to the above, an alternative embodiment of the invention features a digit driver chip mounted on top of an integrated circuit watch chip, with wire bonds leading from selected pads on the digit driver chip to selected pads on the integrated circuit watch chip and from selected pads on the digit driver chip to selected circuit paths on the printed circuit board. This construction results in a reduction in the overall area required for the printed circuit board since the area occupied by the digit driver chip and the circuit paths connecting the digit driver chip and the integrated circuit watch chip is no longer needed. The construction according to the present invention also results in increased reliability and decreased cost since the direct connection of the digit driver circuit chip and the integrated circuit watch chip, without an intermediate circuit path on the printed circuit board, results in a decrease in the total number of wire bonds required for the circuit.

Although the above constructions are described with reference to a digital watch, this is by way of example only. It is obvious that the constructions according to the present invention may find application, either individually or in combination in any number of miniature electronic devices including: communication devices such as hearing aids, radio and television, computer and calculator devices, and bio-medical electronic devices.

It is an object of the present invention to provide an ultra-thin digital watch.

Another object of the present invention is to provide a digital watch incorporating a printed circuit board which permits offset mounting of a display device and watch batteries.

Another object of the invention is to provide an interstitial printed circuit board having apertures for the mounting of batteries and on which circuit components are mounted in the insides between the apertures.

Another object of the present invention is to provide a printed circuit board having a circuit path disposed on a peripheral edge connecting circuit paths disposed on upper and on lower surfaces of the printed circuit board.

Another object of the present invention is to provide a printed circuit board having a digit driver chip mounted on top of an integrated circuit chip.

Another object of the invention is to provide a digital watch having a solid state touch operated switch.

Another object of the invention is to provide a printed circuit board for a digital watch having a transparent printed circuit board protector.

Still another object of the invention is to provide a digital watch incorporating a four digit light emitting diode display in which corresponding segments of the digits are joined by wire bonds.

Additional objects and advantages of the invention will become apparent during the course of the following specification, when taken in connection with the accompanying drawings, in which:

Figure 1:
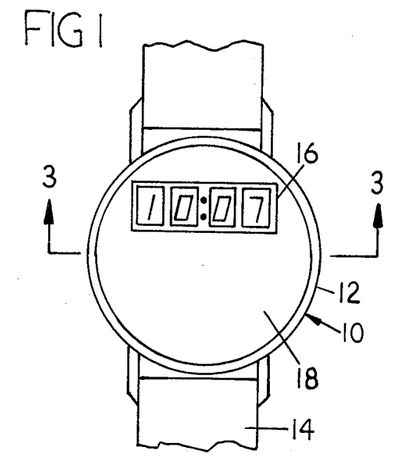
FIG. 1 is a top view of an ultra-thin digital watch in accordance with the present invention.
Figure 2:
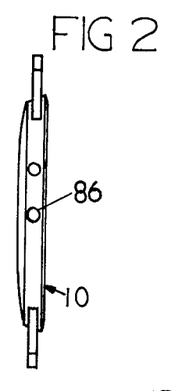
FIG. 2 is a side view of the digital watch of FIG. 1.
Figure 6:
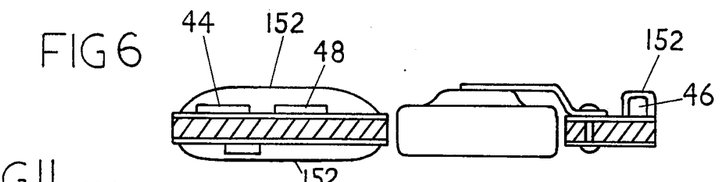
FIG. 6 is a sectional view taken along the line 6—6 of FIG. 4.

With reference to the drawings, there is shown in FIG. 1 a top view of an ultra-thin digital watch 10 made in accordance with the present invention. The digital watch 10 includes a circular watch case 12 which is attached to a wrist band 14. A digital display device 16 which may be either of a liquid crystal type or a light emitting diode type is visible through a watch crystal 18 which covers the upper portion 20 of the watch case 12. The side view of the digital watch 10, shown in FIG. 2, indicates the extreme thinness of the digital watch 10 which is accomplished according to the present invention. The extreme thinness of the digital watch 10 is accomplished, in part, through the provision of a interstitial printed circuit board 22. The interstitial printed circuit board 22 has a circular edge 24 which fits within the watch case 12 and has a pair of circular holes 26 and 28 into which a pair of watch batteries 30 and 32 are inserted. The interstitial printed circuit board 22 has a minimum wall thickness between the holes 26 and 28 and the circular edge 24 in the areas 34 and 36 and a minimum wall thickness in the area 38 between the holes 26 and 28. The holes 26 and 28 are thus nearly tangent to each other and nearly tangent to the circular edge 24 thus providing the maximum unobstructed area obtainable for the location of circuit paths which are indicated typically as the circuit paths 40 and 42 and for circuit components which include: an integrated circuit watch chip 44, a photo sensor 46 and a four digit light emitting diode display 48. The location of the batteries 30, 32 extending into the holes 26, 28 in the interstitial printed circuit board 22 makes possible the provision of a digital watch 10 which is considerably thinner than a conventional digital watch since the integrated circuit watch chip 44, the digital display 38 and the photo sensor 46 are offset from the watch batteries 30, 32 and thus can be positioned within the overall height of the watch batteries 30, 32, as is shown in FIG. 6, rather than on top of the watch batteries 30, 32, as is the case for a conventional digital watch.

Figure 4:
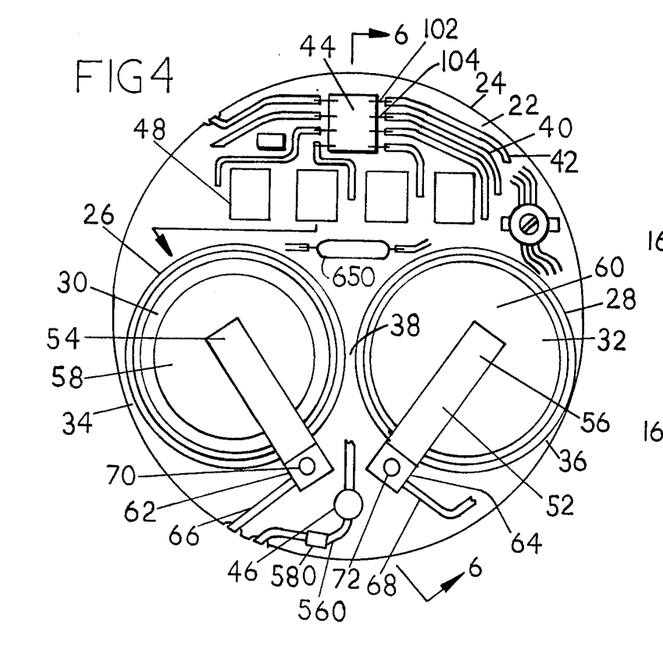
FIG. 4 is a top view of the interstitial printed circuit board of the digital watch of FIG. 1.

The batteries 30 and 32 are connected electrically to the interstitial printed circuit board 22 via the leaf springs 50 and 52. The leaf springs 50 and 52 have outer ends 54 and 56 which are in contact with the negative terminal 58 of the battery 30 and the positive terminal 60 of the battery 32, respectively. The leaf springs 40 and 52 have inner ends 63 and 64 which are soldered to circuit paths 66 and 68 for electrical conductivity and are also secured to the interstitial printed circuit board 22 by rivets 70 and 72, respectively.

Figure 3:
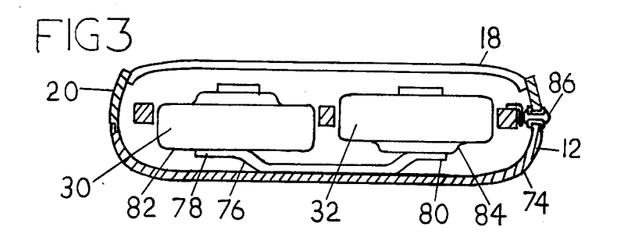
FIG. 3 is a sectional view taken along the line 3—3 of FIG. 1.
Figure 5:
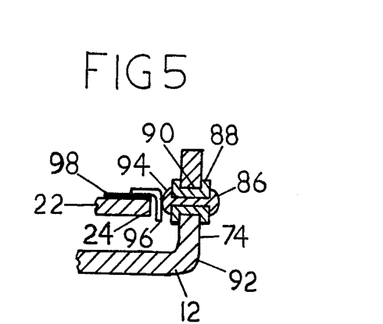
FIG. 5 is an enlarged protion of the sectional view of FIG. 3 showing details of construction of the touch switch.

The lower half 74 of the watch case 12 includes a leaf spring 76 which has ends 78 and 80 which are in contact with the positive terminal 82 of the battery 30 and the negative terminal 84 of the battery 32, respectively thus placing the batteries 30 and 32 in series connection. The lower half 74 of the watch case 12 also includes a rivet 86 which is mounted in an insulating sleeve 88 which is placed in a hole 90 in the side wall 92 of the lower half 74 of the watch case 12. The end 94 of the rivet 86 is in contact with a contact spring 96 which projects over the edge 24 of the interstitial printed circuit board 22. The contact spring 96 is soldered to a circuit path 98 on the interstitial printed circuit board 22 thus providing electrical contact between the rivet 86 and the circuit path 98 and making possible the installation and removal of the interstitial printed circuit board 22 in the watch case 12 without the need for the soldering of leads. The rivet 86 and the watch case 12 serve as the contacts for a solid state touch switch 100 which will be described presently.

Figure 11:
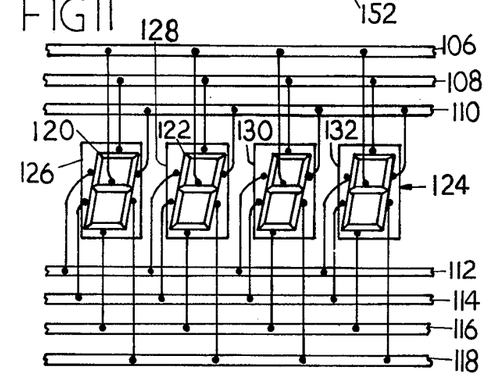
FIG. 11 is a top view of a portion of a printed circuit board showing a conventional method of connection for a four digit light emitting diode display.

The integrated circuit watch chip 44 which incorporates timekeeping and which may also incorporate date keeping functions is connected electrically to selected circuit paths, shown typically as the circuit paths 40 and 42 via a plurality of wire bonds, shown typically as the wire bonds 102 and 104. A four digit light emitting diode display 48 is mounted on the interstitial printed circuit board 22 adjacent to the integrated circuit watch chip 44 and is connected electrically to the interstitial printed circuit board 22 in a manner which differs from the conventional method for connecting light emitting diode displays. Conventionally, light emitting diode digital displays are connected to a plurality of parallel circuit paths 106, 108, 110, 112, 114, 116 and 118 which are disposed adjacent to the display, as is shown in FIG. 11. For a seven segment numerical display, seven circuit paths are required and corresponding segments, such as the segments 120 and 122, are connected to a common circuit path 108. The display 124 in FIG. 11, which is shown for clarity as indicating the numerals 8888, is activated by multiplex signals to the seven circuit paths 106, 108, 110, 112, 114, 116 and 118 and to the back plane of each of the light emitting diode displays 176, 178, 130 and 132.

Figure 12:
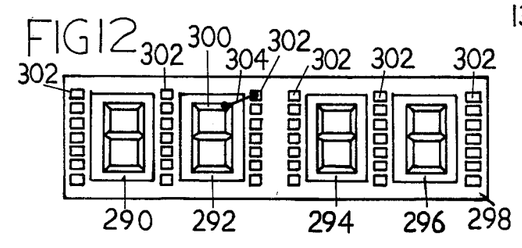
FIG. 12 is a top view of a second conventional method of connection for a four digit light emitting diode display.

Another conventional method of connecting light emitting diode displays is shown in FIG. 12. Four light emitting diode numerical displays 290, 292, 294, and 296 are mounted on a multilayer printed circuit board 298 and individual segments, such as the segment 300, of each of the light emitting diode numerical displays 290, 292, 294 and 296 are connected to a terminal pad such as the terminal pad 302 via a wire bond 304. The terminal pads 302 are interconnected via the multi-layer printed circuit board 298 to effect an interconnection between corresponding segments of the numerical displays 290, 292, 294 and 296. The numerical displays 290, 292, 294 and 296 are spaced apart in order to accommodate the width of the terminal pads resulting in a relatively wide display. The use of a multi-layer printed circuit board 298 results in a relatively thick display which is also relatively costly.

Figure 13:
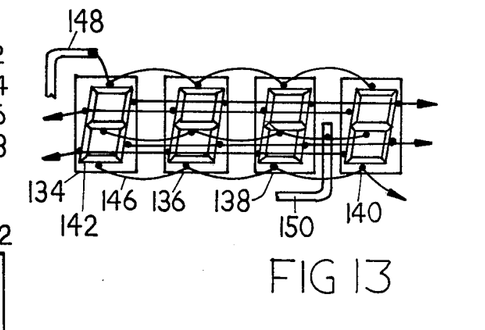
FIG. 13 is a top view of a portion of a printed circuit board showing the method of connection according to the present invention for a four digit light emitting diode display.

In contrast to the above, in accordance with the present invention, the light emitting diode displays 134, 136, 138 and 140, are connected in the manner shown in FIG. 13. Corresponding segments, indicated typically as the segments 142 and 144 of the displays 134 and 136 are connected to each other via a wire bond 146 which extend across the face of the display. The wire bonds are routed in approximately straight lines in order to accomplish efficient manufacture. The wire used in the wire bonds is of the order of 0.001 inches in diameter and even though the wire bonds extend across the face of the display the wire bonds are virtually invisible to the naked eye. The wire used in the wire bonds is preferably aluminum and the light color of the wire contributes to the relative invisibility of the wire bonds. The wire bonds are attached to circuit paths on the interstitial printed circuit board 22, shown typically as the circuit paths 148 and 150. The elimination of the conventional seven circuit paths 106, 108, 110, 112, 114, 116 and 118 of FIG. 11 makes possible an improvement in the packaging efficiency of the light emitting diode display 124 and a reduction in the number of wire bonds required with a consequent increase in reliability.

In a first embodiment of the present invention, the interstitial printed circuit board 22 is coated with a clear expoxy resin 152. This coating 152 serves to protect the components and the wire bonds on the interstitial printed circuit board 22 and permits the viewing of the numbers generated by the display 48. The coating 152 also adds to the structural rigidity and mechanical integrity of the circuit board 22.

Figure 7:
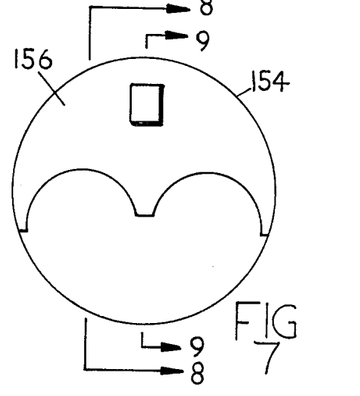
FIG. 7 is a top view of a printed circuit board protector for use with the interstitial printed circuit board of FIG. 4.
Figure 8:
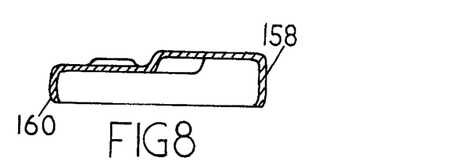
FIG. 8 is a sectional view taken along the line 8—8 of FIG. 7.
Figure 9:
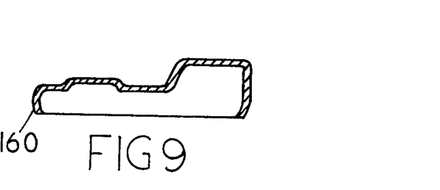
FIG. 9 is a sectional view taken along the line 9—9 of FIG. 7.
Figure 10:
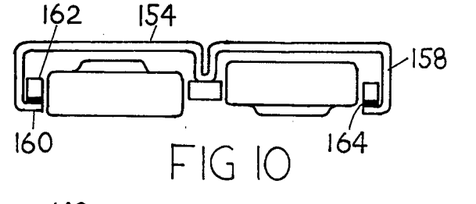
FIG. 10 is a sectional view similar to FIG. 3 showing the installation of the printed circuit board protector of FIG. 7.

In a second embodiment of the present invention, a transparent plastic printed circuit protector 154 is used in lieu of the clear expoxy resin 152. The printed circuit protector 154 has a molded face portion 156 which has contours which conform to the contour of the integrated circuit watch chip 48 and to the watch batteries 30 and 32 thus permitting the printed circuit card protector 154 to fit closely to the surface of the interstitial printed circuit board 22. The printed circuit protector 154 has a rim 158 which extends over the edge 24 of the interstitial printed circuit board 22 and an edge portion 160 which extends slightly over the bottom surface 162 of the interstitial printed circuit board 22 thus retaining the printed circuit protector 154 in place. The rim 158 of the printed circuit protector 154 is attached to the interstitial printed circuit board 22 by a thin layer of cement 164. The printed circuit protectors 154 may be made of one of a number of clear plastic materials which can be formed by a molding or vacuum forming process. Protection for the components and the wire bonds is provided by the printed circuit protector 154 and visibility of the display 48 through the clear plastic face portion 156 of the printed circuit protector 154 is unimpaired. In addition, the printed circuit protector 154 may easily be removed from the interstitial printed circuit board 22 by cutting away the layer of cement 164, thus facilitating access to and repair of the components on the interstitial printed circuit board 22, if required.

Figure 14:
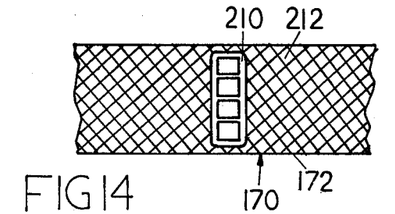
FIG. 14 is a fragmentary top view of another embodiment of the ultra-thin digital watch according to the present invention, with the digital watch mounted in a bracelet.
Figure 16:
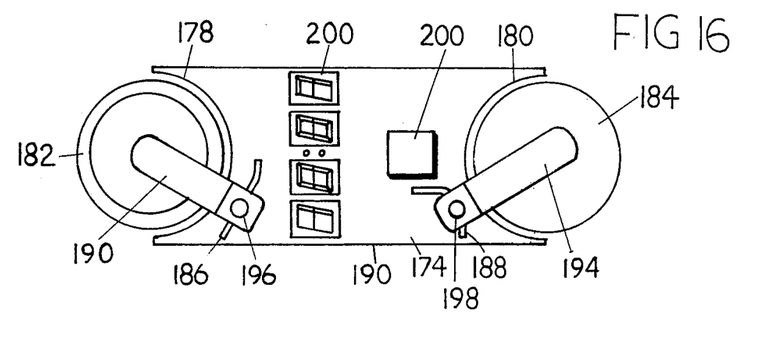
FIG. 16 is a top view of the interstitial printed circuit board of the digital watch of FIG. 14.
Figure 17:
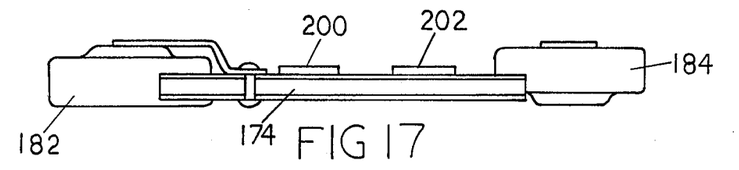
FIG. 17 is a side view of the interstitial printed circuit board of FIG. 16.

In an additional embodiment of the present invention, an ultra-thin digital watch 170 is incorporated in a bracelet 122, as shown in FIG. 14, which may be made of precious or decorative metal and which may have the appearance of fine chain links or mesh. As a result of the use of the interstitial printed circuit board 174 shown in FIG. 16 the digital watch 170 is contained within a watch case 176 which is extremely thin and which conforms closely to the overall configuration of the bracelet 172 thus preserving the overall impression of the bracelet 172 as an object of jewelry.

Figure 15:
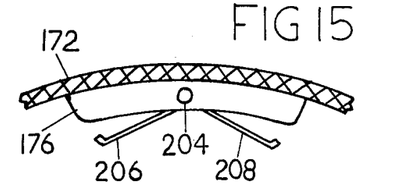
FIG. 15 is a side view of the digital watch of FIG. 14.

The interstitial printed circuit board 174 has a pair of spaced apart semi-circular apertures 178 and 180 which conform to the diameter of the watch batteries 182 and 184. The watch batteries 182 and 184 are connected electrically to the circuit paths 186 and 188 which are formed on the non-conductive substrate 190 by conductive leaf springs 190 and 194 which are similar to the leaf springs 54 and 56 and which are attached to the interstitial printed circuit board 174 by soldering to the respective circuit paths 186 and 188 and by rivets 196 and 198, respectively. A four digit light emitting diode display 200 and an integrated circuit watch chip 202 are mounted on the interstitial circuit board 174 and are connected electrically to the interstitial printed circuit board 174 via the wire bond arrangement according to the present invention, previously described. The watch batteries 182 and 184 and the interstitial printed circuit board 174 form an co-planar assembly with the display 200 and the integrated circuit watch chip 202 and additional circuit components offset from the watch batteries 182 and 184 thus achieving a degree of thinness of the watch case 176 and the bracelet 172 which is not otherwise obtainable. The bottom surface 204 of the watch case 176 in a first alternative construction, shown in FIG. 15, has a pair of lids 206 and 208 which may be opened as shown, to permit replacement of the watch batteries 182 and 184. In the construction shown in FIG. 14, the light emitting diode display 200 is visible through a crystal 210 set into the top surface 212 of the bracelet 172. Additional alternative constructions of the bracelet 172 are shown in FIGS. 18 and 19.

Figure 18:
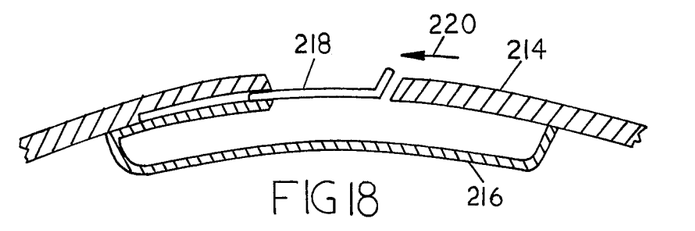
FIG. 18 is longitudinal sectional view of an alternative construction of the bracelet of FIG. 14 showing a sliding lid which normally covers the digital display.

FIG. 18 shows a bracelet 214 having a watch case 216 in which a cover 218 slides in the direction of the arrow 220 to reveal the light emitting diode display 200.

Figure 19:
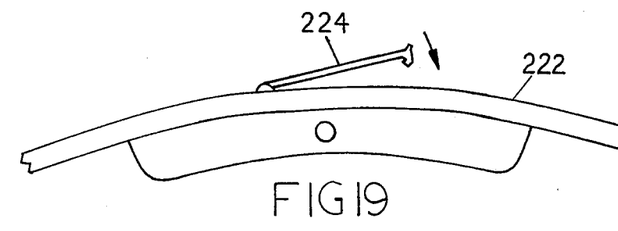
FIG. 19 is a side view of another alternative construction of the bracelet of FIG. 13 showing a hinged lid.

FIG. 19 shows a bracelet 222 having a hinged cover 224 which may be opened to reveal the light emitting diode display 200.

Figure 20:
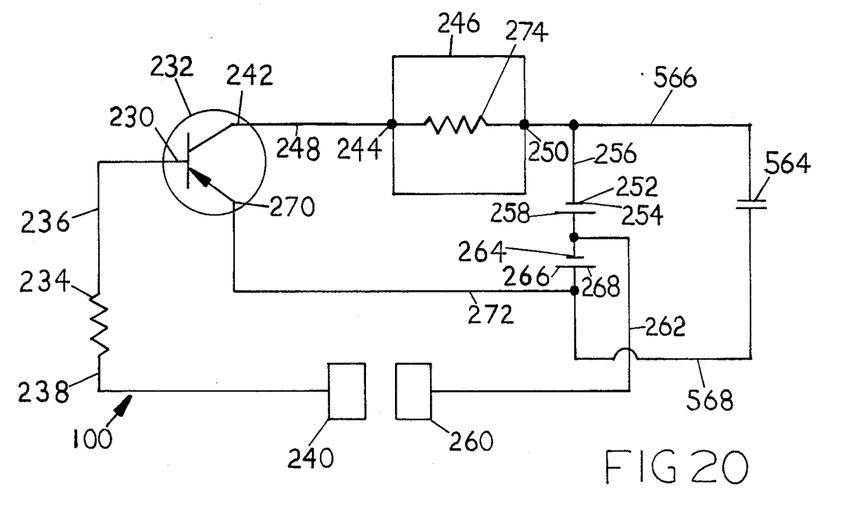
FIG. 20 is a schematic diagram of a solid state touch switch for the digital watch of FIG. 1.

The ultra-thin digital watches 10 and 170 feature a solid state touch operated switch 100 to illuminate the light emitting diode displays 48 and 200. A schematic diagram of the switch 100 is shown in FIG. 20. The base 230 of a PNP bipolar transistor 232 is connected to a resistor 234 via the lead 236. The resistor 234 has a preferred resistance value in the order of one kilo-ohms. The lead 238 connects the resistor 234 to the circuit path 98 of FIG. 5 which leads to the contact spring 96, which bears against the rivet 86. The circuit path 98, the contact spring 96 and the rivet 86 are represented schematically by the rectangle 240 in FIG. 20. The collector 242 of the PNP bipolar transistor 232 is connected to the demand pad 244 of the integrated circuit watch chip 246 via the lead 248 and the negative bonding pad 250 of the integrated circuit watch chip 246 is connected to the negative terminal 252 of a first watch battery 254 via the lead 256. The positive terminal 258 of the first watch battery 254 is connected to the watch case 12, which is represented schematically by the rectangle 260 in FIG. 19, via the lead 262. The lead 262 is also connected to the negative terminal 264 of a second watch battery 266, the positive terminal 268 of which is connected to the emitter 270 of the PNP bipolar transistor 232 via the lead 272. The demand pad 244 and the negative bonding pad 250 of the integrated circuit watch chip 246 are connected via the internal resistor 274.

In operation, when the finger of a user is placed in contact with the rivet 86 and the watch case 12, a negative pulse is applied to the base 230 of the PNP bipolar transistor 232 causing it to conduct and thus applying a positive pulse to the demand pad 244 of the integrated circuit watch chip 246. The application of this positive pulse to the demand pad 244 of the integrated circuit watch chip 246 causes the display to illuminate. When there is no contact across the terminals 240 and 260 of the touch switch 100 the demand pad 244 of the integrated circuit watch chip 246 is at a negative voltage thus turning off the display 48.

The solid state touch operated switch 100 also includes a capacitor 564 connected in parallel with the batteries 254 and 266 via the leads 566 and 568. The capacitor has a preferred minimum value of 0.01 microfarads and serves to prevent unwanted intermittent illumination of the display 16 due to instantaneous disconnection of the batteries 256 and 266 caused by mechanical shock during the wearing of the digital watch 10.

Alternatively, an NPN transistor may be used in lieu of the PNP transistor 232 with the connection of the lead 248 changed to connect to the emitter of the NPN transistor and the connection of the lead 272 changed to connect to the collector of the NPN transistor. In addition, when an NPN transistor is used in lieu of the PNP transistor, the current limiting resistor 234 may be eliminated.

Although the solid state touch switch and the interstitial printed circuit boards have been described with reference to ultra-thin digital watches it is obvious that they may find application, either individually or in combination, in numerous miniature electronic devices, such as hearing aids, radios and other communication equipment, computer and calculator devices and biomedical electronic devices.

Figure 21:
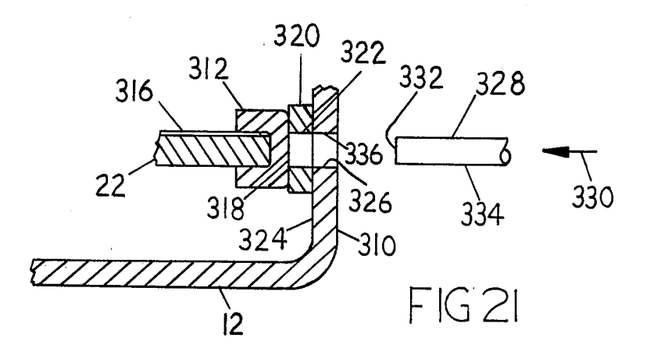
FIG. 21 is a sectional view of a stylus operated setting switch which is incorporated in the digital watch of FIG. 1.

The digital watch 10 according to the present invention also features a stylus activated setting switch 310 for the setting of time and date functions. The use of the stylus activated switch 310 rather than a touch operated switch prevents the inadvertent setting of these functions. The stylus activated switch 310 shown in FIG. 21 includes a conductive elastonner C shaped channel 312 which fits over the edge 314 of the interstitial printed circuit board 22 and makes contact with the circuit path 316. The back 318 of the channel 312 is in contact with a non-conductive elastomer portion 320 which has an aperture 322 and which is in contact with the inside surface 324 of the watch case 12. The watch case 12 has an aperture 326 which is in registry with the aperture 322. In use, a conductive stylus is inserted in the aperture 32, in the direction shown by the arrow 330, and the end 332 of the stylus 328 is pressed against the back 318 of the conductive elastomer C shaped channel 312 while the side 334 of the stylus 328 is placed in contact with the side wall 336 of the aperture 326, thus completing a circuit between the circuit path 316 and the watch case 12. The conductive elastomer C shaped channel 312 and the non-conductive elastomer portion 320 are pre-compressed to prevent the entry of moisture into the watch case 12 through the aperture 326.

Figure 22:
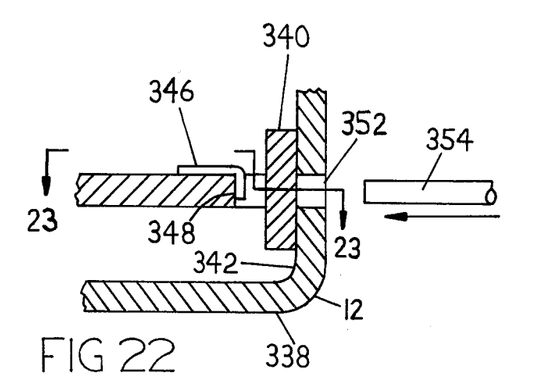
FIG. 22 is a sectional view of an alternative construction of a stylus-operated setting switch.
Figure 23:
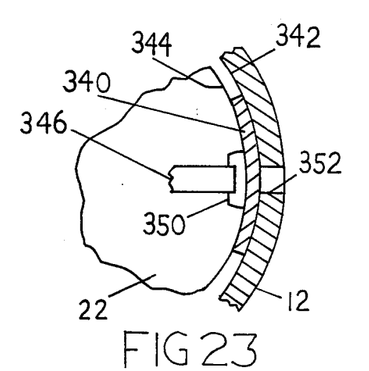
FIG. 23 is a fragmentary sectional view taken along the line 23—23 of FIG. 22.

FIGS. 22 and 23 show an alternative construction of a stylus activated switch. The stylus activated switch 338 includes an conductive elastomer pad 340 which is seated between the inside surface 342 of the watch case 12 and the edge 344 of the interstitial printed circuit board 22. The interstitial printed circuit board 22 has a conductive portion 346 which is mounted or plated on the edge 348 of the interstitial printed circuit board 22, in the recessed portion 350, and is normally not in contact with the conductive elastomer pad 340 as shown in FIG. 23. The watch case 12 has an aperture 352 in registry with the conductive portion 346. The elastomeric pad 340 may be cemented to the inside surface 342 of the watch case 12 using an electrically conductive cement. In use, a stylus 354, which may be non-conductive is pushed through the aperture 352, in the direction shown by the arrow 356, and presses the conductive elastomer pad 340 against the conductive portion 346, thus completing a circuit between the conductive portion 346, and the watch case 12. The conductive elastomer pad 340 prevents the entry of moisture into the watch case 12 through the aperture 352.

The photo sensor 46, shown in FIG. 4, which serves to increase the brightness levels, may be a cadmium sulphide photocell, a photo diode or a photo transistor. In the event that a photo transistor or a photo diode is used, the interstitial printed circuit board 22 includes a diode 558 connected in series with the photo diode by circuit path 560. The diode 558 serves to decrease the sensitivity of the photo diode to rapidly changing ambient light levels, such as produced by a fluorescent lamp, and thus prevents the photo diode from changing the brightness level of the digital display responsive to these rapidly changing ambient light levels. Alternatively, a capacitor connected in parallel with the photo transistor or the photo diode may be used in lieu of the diode 558.

Figure 24:
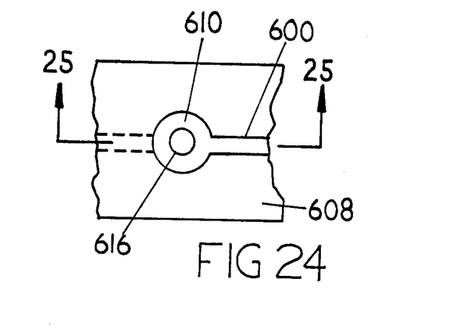
FIG. 24 is an enlarged fragmentary top view of a conventional printed circuit board showing a plated hole connection connecting circuit paths on the top and bottom surfaces of the printed circuit board.
Figure 25:
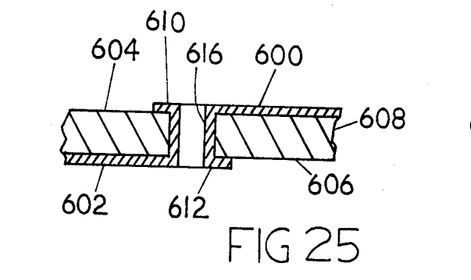
FIG. 25 is a sectional view taken along the line 25—25 of FIG. 24.
Figure 26:
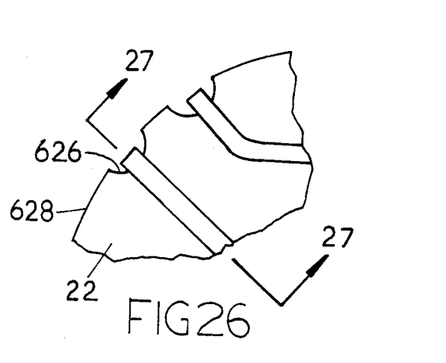
FIG. 26 is an enlarged fragmentary view of a portion of the printed circuit board of FIG. 4 showing a recessed edge connection, according to the present invention, connecting circuit paths on the top and bottom surfaces of the printed circuit board.
Figure 27:
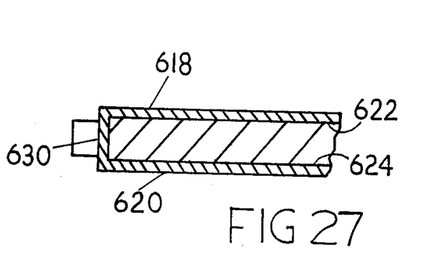
FIG. 27 is a sectional view taken along the line 27—27 of FIG. 26.

FIGS. 24 and 25 show a conventional method for connecting circuit paths 600 and 602, located on the upper and lower surfaces 604, 606 respectively of the printed circuit board 608. The circuit paths 600 and 602 each have a circular pad 610 and 612 through which a hole 616 is drilled. The peripheral surface 616 of the hole 614 is plated and the plating connects the pads 610 and 612. FIGS. 26 and 27 are enlarged fragmentary views of a portion of the printed circuit board 22 of FIG. 4 showing a recessed edge connection, according to the present invention connecting the circuit paths 618 and 620 on the upper lower surfaces 622 and 624, respectively, of the printed circuit board 22. The circuit paths 618 and 620 extend to a recess 626 formed on the edge 628 of the printed circuit board 22 and are connected by a circuit path 630 disposed within the recess 626.

Figure 28:
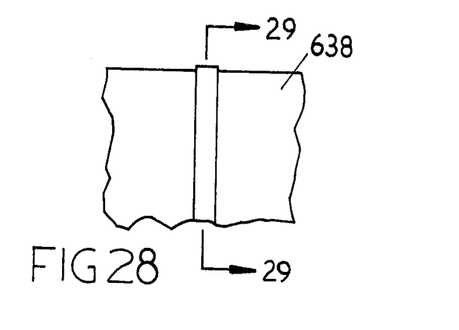
FIG. 28 is an enlarged fragmentary top view of a printed circuit board showing an alternative edge connection.
Figure 29:
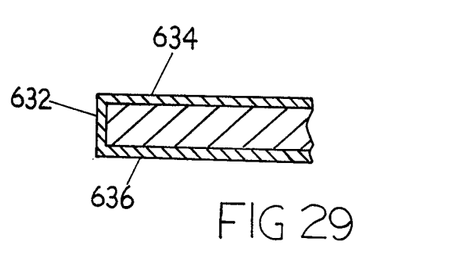
FIG. 29 is a sectional view taken along the line 29—29 of FIG. 28.

The recess 626 prevents unwanted contact between the circuit path 630 and adjacent structures such as the watch case 12. This construction eliminates the need for relatively large diameter pads 610 and 612 and a drilled hole 614 thus reducing the printed circuit board area required to connect the circuit paths 618 and 620. In addition, this construction moves the connecting circuit path 630 to the edge of the printed circuit board 22 leaving the control portion of the printed circuit board 22 available for the mounting of various circuit components. In an alternative construction, shown in FIGS. 28 and 29, the circuit path 632 which connects the circuit paths 634 and 636 is disposed on the edge 638 of the printed circuit board 640 rather than in a recess. This construction may be used when there are no adjacent structures which may contact and short the circuit path 632.

Figure 30:
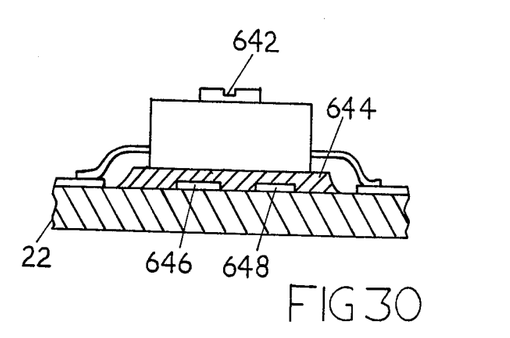
FIG. 30 is an enlarged fragmentary cross sectional view taken along the line 30—30 of FIG. 4 showing the installation of a trimmer capacitor on an insulating layer which covers circuit paths.

FIG. 30 is an enlarged fragmentary cross-sectional view showing the installation of a trimmer capacitor 642 on the printed circuit board 22. The trimmer capacitor 642 is mounted on an insulating layer 644, which may be an epoxy resin which covers and insulates the circuit paths 646 and 648 which extend below the trimmer capacitor 642. The use of the insulating layer 644 permits the circuit paths 646 and 648 to run below the trimmer capacitor 642 rather than around the trimmer capacitor 642 thus conserving printed circuit board area and adding to the overall packaging efficiency of the printed circuit board 22.

Figure 31:
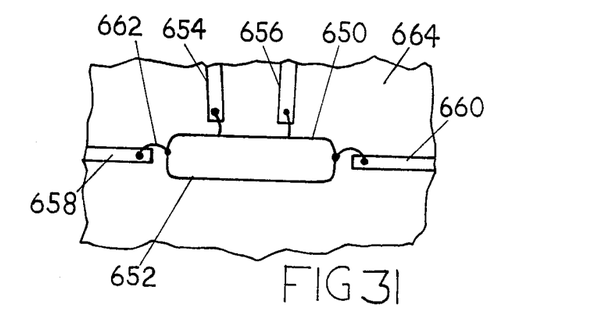
FIG. 31 is an enlarged fragmentary top view of a portion of the printed circuit board of FIG. 4 showing the connection of circuit paths to the case of a crystal oscillator to carry signals from point to point on the printed circuit board.

FIG. 31 is an enlarged elevation view of a crystal oscillator 650 which is mounted on the printed circuit board 22 in accordance with the present invention. The crystal oscillator 650 has a metal case 652 which is insulated electrically from the active components contained within the case 652. The active components of the crystal oscillator 650 are connected to the digital watch circuit via the circuit paths 654 and 656. Circuit paths 658 and 660 are connected to the case 652 via the bonded leads 662 and 664. The case 652 thus conducts signals between the circuit paths 658 and 660 thus eliminating the need for a circuit path directed around the case 652 thereby reducing the required printed circuit board area and increasing the packaging efficiency of the printed circuit board 22.

Figure 32:
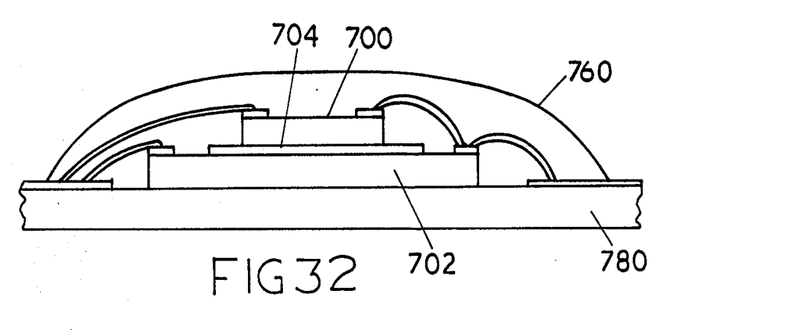
FIG. 32 is a fragmentary elevation view of an alternative embodiment of the printed circuit board according to the present invention showing a digit driver chip mounted on top of an integrated circuit watch chip.
Figure 33:
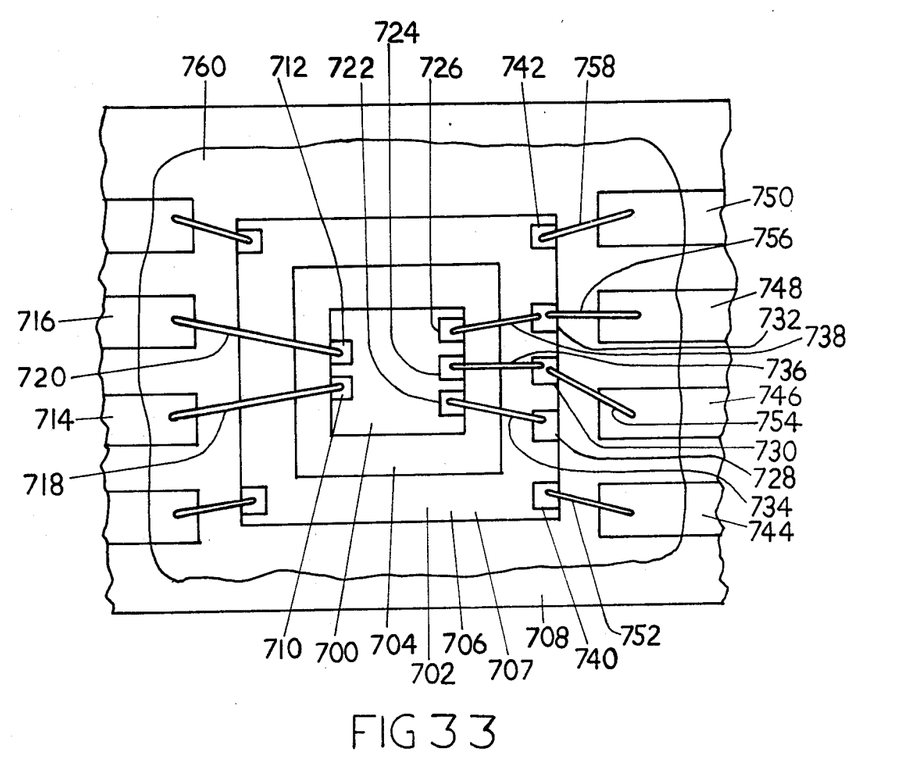
FIG. 33 is a fragmentary top view of the printed circuit board of FIG. 32.

FIGS. 32 and 33 show enlarged fragments of an alternative embodiment of the interstitial printed circuit board 22 in which a digit driver chip 700 is mounted on top of an integrated circuit watch chip 702. The digit driver chip 700 is used to amplify the output current of the integrated circuit watch chip 702 to the level required by light emitting diode display devices. The digit driver chip 700 is mounted on an insulating layer 704 which is disposed on the top surface 706 of the integrated circuit watch chip 702. The insulating layer 704 may be a thin layer of glass which is formed on the integrated circuit watch chip case 707 by a process known as glassivation or, a layer of non-conductive epoxy or, a sheet of dielectric plastic material such as mylar. The digit driver chip 700 is attached to the integrated circuit watch chip 702, and the integrated circuit watch chip 702 is attached to the printed circuit board substrate 708 using a non-conductive epoxy adhesive.

Selected pads, on the digit driver chip 700, shown by way of example as the pads 710 and 712 are attached to circuit paths 714 and 716 on the printed circuit board substrate 708 via wire bonds 718 and 720. Selected pads on the digit driver chip 700, shown, by way of example, as the pads 722, 724 and 726 are attached to the pads 728, 730 and 732 via the wire bonds 734, 736 and 738. Pads 740, 728, 730, 732 and 742 on the integrated circuit watch chip 702 are attached to the circuit paths 744, 746, 748 and 750 via the wire bonds 752, 754, 756 and 758.

The digit driver chip 700 and the integrated circuit watch chip 702 and the wire bonds 718, 720, 728, 736, 738, 752, 754, 756, and 758 may be protected by a coating of epoxy resin 760 as shown in FIG. 32.

Figure 34:
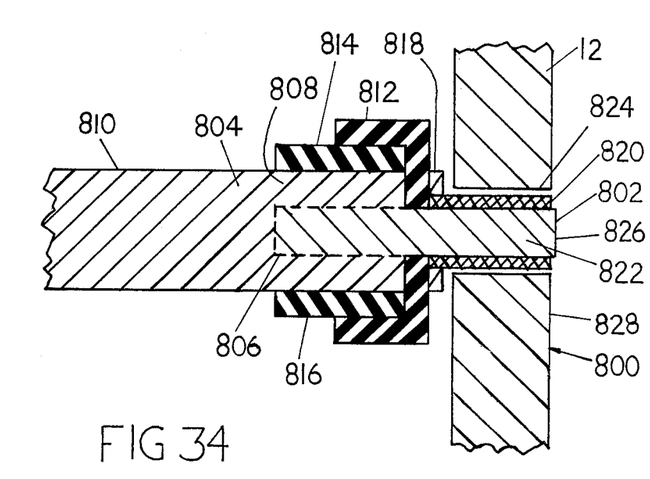
FIG. 34 is a fragmentary sectional view of an alternative switch contact for the solid state touch switch of FIG. 20.

FIG. 34 shows an enlarged gragmentary sectional view of an alternative switch contact 800 for the solid state touch switch 100 of FIG. 20. The switch contact 800 comprises a conductive rivet or cylinder 802 which has an end 804 extending into the hole 806 formed in the edge 808 of the printed circuit board 810. The printed circuit board 810 has a recess 818 similar to the recess 350 in FIG. 23. A conductive C clip 812 extends over the top and bottom circuit paths 814 and 816 which are on the printed circuit board 810. The conductive C clip 812 is disposed within the recess 818 in a manner similar to the way the conductive portion 346 is disposed within the recess 350. The conductive C clip 812 is connected electrically to the cylinder 802 and to the circuit paths 814 and 816 via solder or other known means. An insulating sleeve 820 is placed over the forward portion 822 of the cylinder 802 which extends through the hole 824 in the watch case 12. The insulating sleeve 820 serves to electrically insulate the cylinder 802 from the watch case 12. The end 826 of the cylinder 802 extends to the outer surface 828 of the watch case 12 and simultaneous contact with the watch case 12 and the end 826 of the cylinder 802 by a conductive member such as a finger of a user places the circuit path 814 and 816 in contact with the watch case 12.

Alternatively the C clip 812 may be replaced by a circuit portion 346 (as in FIG. 23) extending over the edge of printed circuit board 810 and connected to the cylinder 802 via solder or other known means.

While preferred embodiments of the invention have been shown and described herein, it is obvious that numerous additions, changes and omissions may be made in such embodiments without departing from the spirit and scope of the invention.

What is claimed is:

1. A digital watch comprising a watch case, printed circuit means having a pair of apertures, extending through said printed circuit means, with said printed circuit means disposed within said watch case, a pair of batteries disposed within said watch case, electrical connection means connecting said printed circuit means and said batteries, integrated circuit watch chip means mounted on said printed circuit means, digital display means mounted on said printed circuit means, circuit connection means on said printed circuit means connecting said digital display means and said integrated circuit watch chip means, with said batteries disposed extending into said aperture in said printed circuit means with said integrated circuit watch chip means including a demand pad and a negative bonding pad with said integrated circuit watch chip means operating to illuminate said display means for display of a signal responsive to the application of a positive pulse to said demand pad, and further including a solid state touch switch comprising a first and a second terminal insulated from said watch case, a resistor, circuit connection means connecting said resistor and said first terminal, a PNP bipolar transistor having a base, an emitter, and a collector terminal, circuit connection means connecting said resistor and said base terminal, circuit connection means connecting said collector terminal and said demand pad of said integrated circuit chip means, circuit connection means connecting said positive bonding pad of said integrated circuit chip means and the negative terminal of a first of said batteries, circuit connection means connecting the positive terminal of said first battery and the negative terminal of a second of said batteries, circuit connection means connecting the positive terminal of said second battery and said emitter terminal of said PNP bipolar transistor, and circuit connection means connecting said negative terminal of said second battery to said second terminal, whereby contact between said first and second terminals causes the application of a negative pulse to said demand pad causing the display of a signal.

2. A digital watch according to claim 1 further including a capacitor and circuit connection means with said circuit connection means connecting said capacitor to said negative terminal of said first battery and to said positive terminal of said second battery.

3. A digital watch comprising watch case, printed circuit means having a pair of apertures extending through said printed circuit means with said printed circuit means disposed within said watch case, a pair of batteries disposed within said watch case, electrical connection means connecting said printed circuit means and said batteries, integrated circuit watch chip means mounted on said printed circuit means, digital display means mounted on said printed circuit means, circuit connection means on said printed circuit means connecting said digital display means on said integrated circuit watch chip means, with said batteries disposed extending into said aperture in said printed circuit means, with said integrated circuit watch chip means including a demand pad and a negative bonding pad, with said integrated circuit watch chip means operating to operate said display means for display of a time signal responsive to the application of a positive pulse to said demand pad, a NPN bipolar transistor, having a base, a collector and an emitter terminal, and solid state touch switch means comprising a first and a second terminal, insulated from said watch case, circuit connection means connecting said base and said first terminal, circuit connection means connectin said emitter terminal and said demand pad of said integrated circuit watch chip means, circuit connection means connecting said negative bonding pad of said integrated circuit chip means and the negative terminal of a first of said batteries, circuit connection means connecting the positive terminal of said first battery and the negative terminal of a second of said batteries, circuit connection means connecting the positive terminal of said second battery and said collector terminal of said NPN bipolar transistor and circuit connection means connecting said negative terminal of said second battery to said second terminal whereby contact between said first and said second terminals causes the application of a negative pulse to said demand pad, causing the display of a time signal.

4. A digital watch comprising a watch case, printed circuit means having a pair of apertures, extending through said printed circuit means with said printed circuit means disposed within said watch case, a pair of batteries disposed within said watch case, electrical connection means connecting said printed circuit means and said batteries, integrated circuit watch chip means mounted on said printed circuit means, digital display means mounted on said printed circuit means, circuit connection means on said printed circuit means connecting said digital display means and said integrated circuit watch chip means, with said batteries disposed extending into said aperture in said printed circuit means with said integrated circuit watch chip means including a demand pad and a negative bonding pad with said integrated circuit watch chip means operating to illuminate said display means for display of a signal responsive to the application of a positive pulse to said demand pad, and further a solid state touch switch comprising a first terminal insulated from said watch case, a PNP bipolar transistor having a base, an emitter, and a collector terminal, circuit connection means connecting said base and said first terminal, circuit connection means connecting said collector terminal and said demand pad of said integrated circuit chip means, circuit connection means connecting said negative bonding pad of said integrated circuit chip means and the negative terminal of said first battery, circuit connection means connecting the positive terminal of said first battery and the negative terminal of said second battery, circuit connection means connecting the positive terminal of said second battery and said emitter terminal of said PNP bipolar transistor, and circuit connection means connecting said negative terminal of said second battery to said second terminal, whereby contact between said first and second terminals causes the application of a negative pulse to said demand pad causing the display of a signal.

* * * * *